(12) United States Patent
Miura et al.

(10) Patent No.: US 7,825,466 B2
(45) Date of Patent: Nov. 2, 2010

(54) SUPER-JUNCTION SEMICONDUCTOR ELEMENT AND METHOD OF FABRICATING THE SAME

(75) Inventors: Yoshinao Miura, Kanagawa (JP); Hitoshi Ninomiya, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/085,155

(22) Filed: Mar. 22, 2005

(65) Prior Publication Data
US 2005/0212053 A1 Sep. 29, 2005

(30) Foreign Application Priority Data
Mar. 29, 2004 (JP) ............... 2004-096388

(51) Int. Cl.
*H01L 29/06* (2006.01)
(52) U.S. Cl. ............... 257/341; 257/E29.009; 257/409
(58) Field of Classification Search ................. 257/367, 257/E29.009, 330, 341, 342, 409, 508
See application file for complete search history.

(56) References Cited

U.S. PATENT DOCUMENTS

| | | | |
|---|---|---|---|
| 6,844,592 B2 * | 1/2005 | Yamaguchi et al. | 257/341 |
| 7,256,432 B2 * | 8/2007 | Okamoto et al. | 257/192 |
| 2003/0132450 A1 * | 7/2003 | Minato et al. | 257/110 |
| 2004/0206989 A1 * | 10/2004 | Aida et al. | 257/263 |

FOREIGN PATENT DOCUMENTS

| | | |
|---|---|---|
| CN | 1405897 | 3/2003 |
| CN | 1436372 | 8/2003 |
| CN | 1445860 | 10/2003 |
| JP | 2001-135819 | 5/2001 |
| JP | 2003-273355 | 9/2003 |

OTHER PUBLICATIONS

Chinese Office Action dated Aug. 24, 2007 with an English Translation.

* cited by examiner

*Primary Examiner*—Lynne A Gurley
*Assistant Examiner*—Colleen A Matthews
(74) *Attorney, Agent, or Firm*—McGinn IP Law Group, PLLC

(57) ABSTRACT

The present invention provides a super-junction semiconductor element having a high voltage resistance and a low resistivity, while being successfully reduced in the size thereof, which comprises a semiconductor substrate 3; a pair of electrodes 1, 2 provided respectively on a top surface 12 and a back surface 13 of the semiconductor substrate 3; a parallel pn layer provided between the top surface 12 and the back surface 13 of said semiconductor substrate, having n-type semiconductor layers 4 allowing current flow under the ON state but being depleted under the OFF state, and p-type semiconductor layers 5 alternately arranged therein; and an insulating film 6 formed so as to surround the parallel pn layer; wherein the insulating film 6 is formed at a predetermined position.

11 Claims, 13 Drawing Sheets

SUPER-JUNCTION SEMICONDUCTOR ELEMENT AND METHOD OF FABRICATING THE SAME

This application is based on Japanese patent application No. 2004-096388 the content of which is incorporated hereinto by reference.

DISCLOSURE OF THE INVENTION

1. Field of the Invention

The present invention relates to a super-junction semiconductor element and a method of fabricating the same, and in particular to a super-junction semiconductor element containing a structure composed of a parallel pn layer which allows current flow under the ON but depletes under the OFF state.

2. Related Art

In general, semiconductor elements can roughly be classified into lateral elements having an electrode portion only on one surface thereof, and vertical elements having the electrode portions on both surfaces thereof. In particular in the vertical elements, both of the direction of drift current flow under the ON time, and the direction of extension of the depletion layer induced by reverse bias voltage under the OFF state reside in the thickness-wise direction (vertical direction) of the substrate. For the vertical semiconductor elements allowing current to flow between the electrodes provided on two thus-opposing main surfaces, it has been essential, for the purpose of raising the voltage resistance, to ensure a large specific resistance and a certain level of thickness of the high-resistant layer between the electrodes. This consequently results in that an element having a larger voltage resistance will have a larger ON resistance, so that the voltage resistance and ON resistance of the element cannot be harmonized. In order to realize a low-power-consumption element, it is essential to realize low resistivity while keeping a high voltage resistance.

Japanese Laid-Open Patent Publication No. 2001-135819 discloses a technique of realizing a low resistivity while keeping a high voltage resistance of super-junction semiconductor element comprising a drift layer composed of a parallel pn layer which allows current flow under ON state but being depleted under OFF state, by providing at the outer peripheral portion of the element surrounding the active portion of the element the parallel pn layer in which first-conductivity-type drift regions composed of an n-type layer and second-conductivity-type partition regions composed of a p-type layer are alternately and repetitively arranged therein.

Japanese Laid-Open Patent Publication No. 2003-273355 discloses a technique of realizing a low resistivity while keeping a high voltage resistance of super-junction semiconductor element, by providing a p-type base layer at the outer peripheral portion of the element surrounding the active portion of the element, connecting the p-type base layer discretely with a p-type drift layer, forming an insulating film on the p-type base layer excluding a certain portion thereof, and forming a field electrode on the insulating film so as to surround the active portion of the element.

SUMMARY OF THE INVENTION

Both techniques disclosed in Japanese Laid-Open Patent Publication No. 2001-135819 and Japanese Laid-Open Patent Publication No. 2003-273355 need a large surface area of the outer peripheral portion of the super-junction semiconductor element, and still have a room for improvement in view of downsizing of the element.

According to the present invention, there is provided a super-junction semiconductor element a semiconductor substrate;

a pair of electrodes provided respectively on the top surface and the back surface of the semiconductor substrate;

a parallel pn layer provided between the top surface and the back surface of the semiconductor substrate, and allowing current flow under the ON state but being depleted under the OFF state, and having first-conductivity-type drift regions and second-conductivity-type partition regions alternately arranged therein;

an insulating film formed on the semiconductor substrate so as to surround the parallel pn layer; and a field plate formed so as to cover at least a part of the insulating film;

wherein an end portion of the insulating film on the parallel pn layer side is arranged either in the outermost partition region of the second-conductivity-type partition region, or in the depleted region of the first-conductivity-type drift region in the vicinity of the outermost partition region formed when the outermost partition region is completely depleted.

This configuration makes the edge (rise-up) portion of the insulating film on the parallel pn layer side fall within the outermost partition region, or on the surface, and is successful in preventing breakdown due to concentration of the electric field at the end potion of the parallel pn layer. On the other hand, substantially similar effects can be obtained by making the rise-up of the insulating film placed on the surface of the depleted region in the drift region generated when the outermost partition region is depleted. Because a high voltage resistance of a super-junction semiconductor element can be realized without forming the parallel pn layer also in the outside of the insulating film formed at the end portion of the element in order to prevent the electric field concentration as described in the above, it is made possible to obtain a super-junction semiconductor element having a high voltage resistance and a low resistivity, while reducing the element area.

In the super-junction semiconductor element, the insulating film may be formed at a position satisfying the formula (1) below:

$$X_F < X_D \quad (1)$$

where, $X_D = (N_A/2N_D) \times X_A$ (where, $X_F$ expresses a distance measured from the outer end portion of the outermost second-conductivity-type partition region, not on the parallel pn layer side, to the end portion on the parallel pn layer side of the insulating film; $X_D$ expresses thickness of the depleted region; $X_A$ expresses thickness of the outermost second-conductivity-type partition region; $N_A$ expresses impurity concentration of the outermost second-conductivity-type partition region; and $N_D$ expresses impurity concentration of the first-conductivity-type drift region).

In the super-junction semiconductor element, thickness $t_{ox}$ of the insulating film and depth $t_{sj}$ of the outermost second-conductivity-type partition region satisfy a relation expressed by the formula (2) below:

$$\epsilon_{ox}/(2\epsilon_{si}) < t_{ox}/t_{sj} \quad (2)$$

(where, $\epsilon_{ox}$ expresses relative dielectric constant of the insulating film; and $\epsilon_{si}$ expresses relative dielectric constant of the semiconductor substrate right under the insulating film).

By adjusting the thickness of the insulating film so as to satisfy the predetermined relation considering relative dielectric constants of the insulating film and the semiconductor substrate, it is made possible to thin the insulating film under optimum conditions, and to consequently make the super-junction semiconductor element excellent in the voltage resistance and low in the resistivity while successfully reducing the element area.

In the super-junction semiconductor element, relative dielectric constant $\varepsilon_{ox}$ of the insulating film may be smaller than 3.9.

In the super-junction semiconductor element, depth of the outermost second-conductivity-type partition region may be smaller than depth of the adjacent second-conductivity-type partition region.

Provision of the outermost second-conductivity-type partition region as being shallower than the adjacent second-conductivity-type partition region as described in the above makes it possible to prevent breakdown from occurring due to concentration of electric field at the end portion of the parallel pn layer. Because a high voltage resistance of the element can be realized without forming the parallel pn layer also in the outside of the insulating film formed at the end portion of the element in order to prevent the electric field concentration as described in the above, it is made possible to reduce the element area, and at the same time to obtain a super-junction semiconductor element having a high voltage resistance and a low resistivity.

In the super-junction semiconductor element, the insulating film may be formed so as to cover at least a part of the outermost second-conductivity-type partition region, and depth $t_{sj}$ of the outermost second-conductivity-type partition region may satisfy a relation expressed by the formula (3) below:

$$t_{sj}' - t_{sj} < (2\varepsilon_{si}/\varepsilon_{ox}) \times t_{ox} \quad (3)$$

(where, $t_{sj}'$ expresses depth of the adjacent second-conductivity-type partition region, $\varepsilon_{si}$ expresses relative dielectric constant of the semiconductor substrate right under the insulating film; $\varepsilon_{ox}$ expresses relative dielectric constant of the insulating film; and $t_{ox}$ expresses mean film thickness of the insulating film).

In the super-junction semiconductor element, the insulating film may be formed so as to cover at least a part of the outermost second-conductivity-type partition region, and so that thickness of the insulating film in the coverage region may increase as becoming more distant from the parallel pn layer.

In the super-junction semiconductor element, the insulating film may be formed so as to cover at least a part of the outermost second-conductivity-type partition region, and depth of the outermost second-conductivity-type partition region in the coverage region may decrease as becoming more distant from the parallel pn layer.

In the super-junction semiconductor element, the outermost second-conductivity-type partition region may be formed with a band pattern, as viewed from right above the top surface.

According to the present invention, there is also provided a method of fabricating a super-junction semiconductor element which comprises:

an insulating film forming step of preliminarily forming an insulating film, which surrounds a region which will have a parallel pn layer comprising first-conductivity-type drift regions and second-conductivity-type partition regions alternately arranged therein by implanting ion into a semiconductor substrate; and an ion implantation step of implanting ion into a region, which will have formed therein a second-conductivity-type partition region, of the semiconductor substrate having the insulating film and a field plate already formed thereon, to form the parallel pn layer, wherein in the ion implantation step, the ion implantation for forming the outermost second-conductivity-type partition region is carried out through the insulating film, to thereby make the outermost second-conductivity-type partition region shallower than other second-conductivity-type partition regions.

In the method of fabricating the super-junction semiconductor element, it is allowable to carry out a field plate formation step of forming the field plate so as to cover at least a part of the already-formed insulating film, after the insulating film formation step, and before the ion implantation step; and in the ion implantation step, the ion implantation for forming the outermost second-conductivity-type partition region is carried out through the insulating film and the field plate, to thereby make the outermost second-conductivity-type partition region shallower than other second-conductivity-type partition regions.

In the method of fabricating the super-junction semiconductor element, it is allowable, in the ion implantation step, to repeat the ion implantation multiple times while varying the ion implantation energy each time.

In the method of fabricating the super-junction semiconductor element, it is allowable, in the insulating film formation step, to form the insulating film by the thermal oxidation process.

This is successful in forming only the outermost second-conductivity-type partition region as being shallower than the adjacent second-conductivity-type partition region when the super-junction semiconductor element is formed.

By virtue of the invention, it is made possible to obtain a super-junction semiconductor element having a high voltage resistance and a low resistivity, while reducing the element area.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
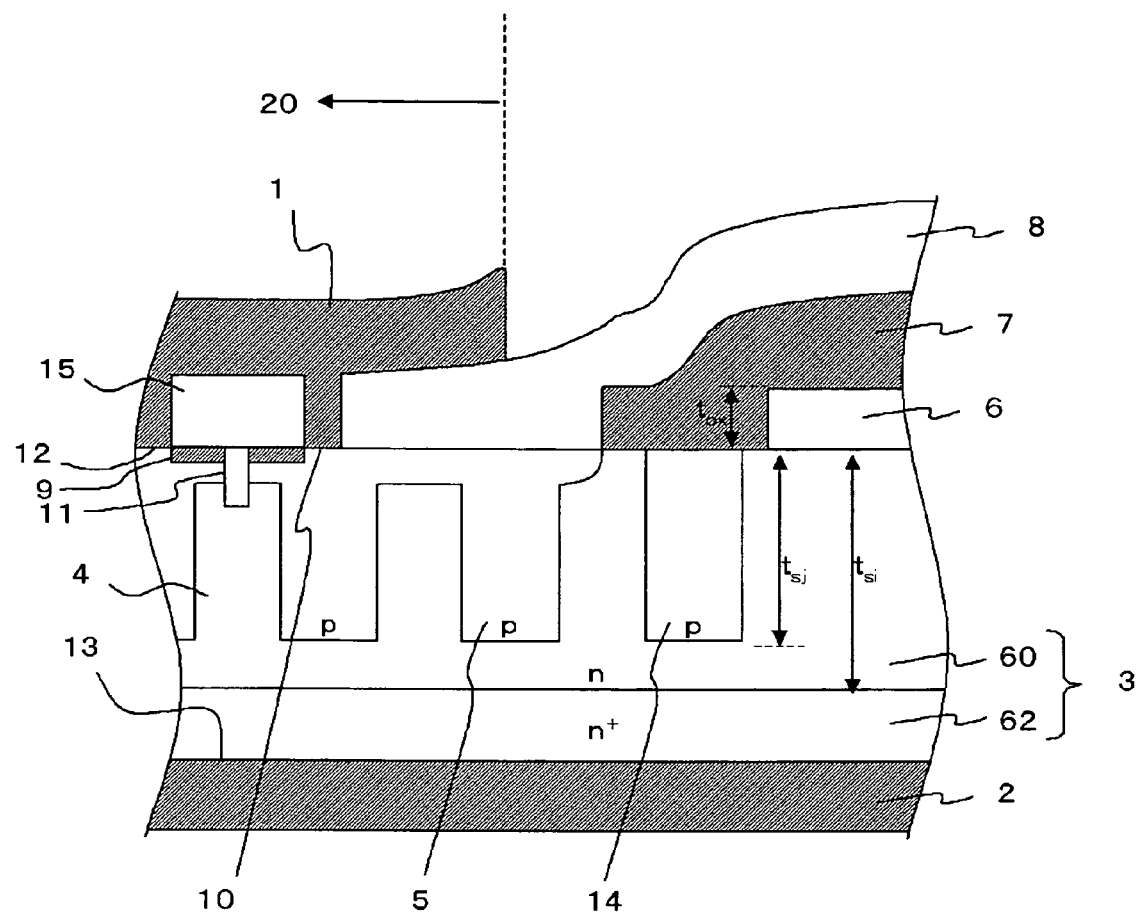
FIG. 1 is a partial sectional view showing a configuration of the outermost portion of the super-junction semiconductor element according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following paragraphs will detail the super-junction semiconductor element and a method of fabricating the same according to the present invention, referring to the attached drawings.

It is to be noted that, in the explanation of the drawings, the same components will be given with the same reference numerals, omitting the repeated explanation.

(First Embodiment)

FIG. 1 is a partial sectional view showing a configuration of the outermost portion of the super-junction semiconductor element according to the first embodiment.

In the first embodiment, as shown in FIG. 1, a semiconductor substrate 3 comprises a high concentration n-type (n⁺-type) semiconductor layer 62, and an epitaxial layer 60 formed on the surface thereof typically by epitaxial growth of silicon under phosphorus doping; and a first electrode (source electrode) 1 and a second electrode (drain electrode) 2 formed on a top surface 12 and a back surface 13, respectively, of the semiconductor substrate 3. Between the top surface 12 and the back surface 13, and over the n⁺-type semiconductor layer 62, a parallel pn layer having n-type semiconductor layers 4 as the first-conductivity-type drift region allowing current flow under the ON state but being depleted under the OFF state, and p-type semiconductor layers 5 as the second-conductivity-type partition regions alternately arranged therein.

There is seen, as viewed from right above the top surface 12, an insulating film 6 is formed so as to surround the parallel pn layer, a field electrode 7 as a field plate is formed so as to further cover the insulating film 6, and an insulating interlayer 8 is formed so as to cover the field electrode 7. It is all enough that the field electrode 7 covers at least a part of the insulating film 6, and the effects of the present invention can be obtained even if it is not electrically connected to an outermost p-type semiconductor layer 14 (as an outmost second-conductivity-type partition region) formed on the outermost portion of the parallel pn layer. It is to be noted that, in the drawing, the field electrode 7 is illustrated so as to contact with the semiconductor substrate 3, but in an actual configuration, an insulating film typically composed of a film of oxide such as SiO₂, which is extremely thin enough to possibly inhibit electrical connection between the field electrode 7 and the semiconductor substrate 3, is formed therebetween.

As viewed from right above the top surface 12, the individual p-type semiconductor layers 5, which reside inside the outermost p-type semiconductor layer 14, form p-type bases, and are not connected to the p-type semiconductor layer 14.

On the other hand, the n-type semiconductor layers 4 are connected with a gate electrode 11, at the portion where a trench is formed, a source electrode 9 is formed around the gate electrode 11 in the vicinity of the top surface of the semiconductor substrate 3, and a gate insulating film 15 is formed on the surface of the source electrode 9. Between the insulating interlayer 8 and the gate insulating film 15, and between the adjacent gate insulating films 15, p-type contacts 10 are formed so as to allow the first electrode 1 to make contact with the p-type semiconductor layer 5. A region where the p-type semiconductor layers 5, forming the p-type bases, are formed is referred to as an element active portion 20 because current flows therethrough upon being applied with voltage from the gate electrode 11.

The insulating film 6 is designed so that the end portion thereof on the parallel pn layer side falls in a depleted region in the n-type semiconductor layer 4 generated in the vicinity of the outermost p-type semiconductor layer 14 when the outermost p-type semiconductor layer 14 is completely depleted.

The OFF state referred to herein is that no voltage is applied by the gate electrode 11, and consequently no current flows through the junction portion, while the voltage applied between the source and drain is applied to the junction portion. The ON state means that voltage is applied to the gate electrode 11, the p-type bases are consequently inverted, to thereby lower the resistivity thereof, and to lower also the voltage applied between the source and drain, and as a consequence, current flows through the junction portion.

The following paragraphs will describe a specific example of the depleted region.

Figure 2:
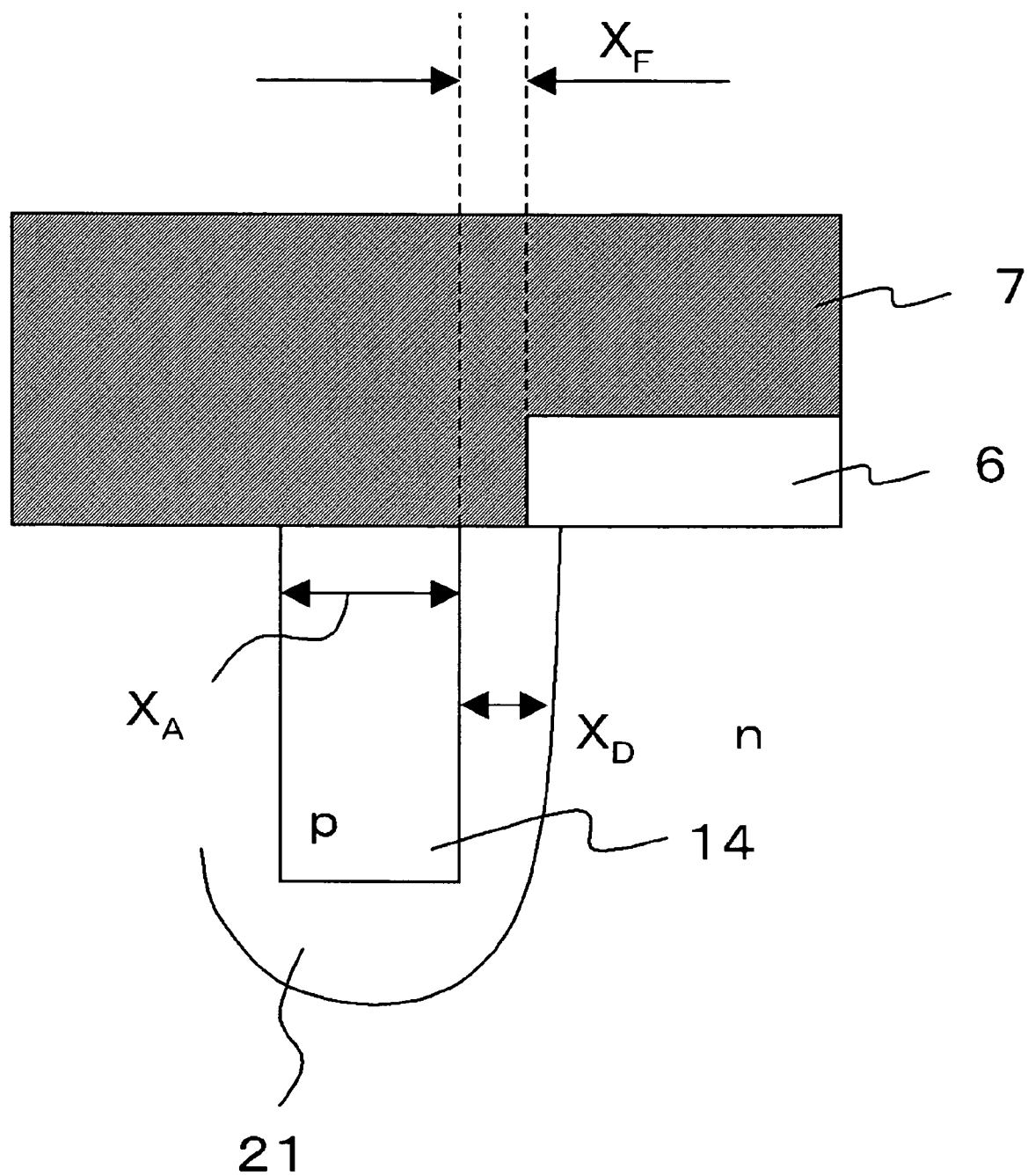
FIG. 2 is a drawing showing a positional relation of an insulating film and an outermost p-type semiconductor layer.

FIG. 2 is a drawing showing a depleted region of the outermost p-type semiconductor layer 14, from which the insulating film 6 rises up. Assuming now that the outermost p-type semiconductor layer 14 is completely depleted upon being applied with voltage by the field electrode 7, and also assuming thickness of a depletion layer 21 generated in the vicinity of the outermost p-type semiconductor layer 14 as $X_D$, thickness of the outermost p-type semiconductor layer 14 as $X_A$, impurity concentration of the n-type semiconductor layer as $N_D$, impurity concentration of the outermost p-type semiconductor layer 14 as $N_A$, and distance of the outer end portion of the outermost p-type semiconductor layer 14 to the end portion of the insulating film 6 as $X_F$, a relation expressed by the formula (1) below is satisfied. In other words, the insulating film 6 is designed so as to rise up at a position by distance $X_F$ away from the outer end portion of the outermost p-type semiconductor layer 14.

$$X_F < X_D \quad (1)$$

where, $X_D = (N_A/2N_D) \times X_A$

By positioning the end portion (rise-up) of the insulating film 6 on the parallel pn layer side so as to fall on the surface of the depleted region in the n-type semiconductor layer 4 generated when the outermost p-type semiconductor layer 14 is depleted, as described in the above, it is made possible to prevent breakdown due to concentration of the electric field at the end potion of the parallel pn layer. Because a high voltage resistance of a super-junction semiconductor element can thus be realized without forming the parallel pn layer also in the outside of the insulating film formed at the end portion of the element in order to prevent the electric field concentration as described in the above, it is made possible to obtain a super-junction semiconductor element having a high voltage resistance and a low resistivity, while reducing the element area.

In view of reducing the element area, it is also preferable that a relation between the thickness $t_{ox}$ of the insulating film 6 and depth $t_{sj}$ of the outmost p-type semiconductor layer 14 satisfy a relation expressed by the formula (2) below.

$$\epsilon_{ox}/2\epsilon_{si} < t_{ox}/t_{sj} \quad (2)$$

(where, $\epsilon_{ox}$ expresses relative dielectric constant of the insulating film, and $\epsilon_{si}$ expresses relative dielectric constant of the semiconductor substrate right under the insulating film).

The relation will be explained below.

Assuming now that the electrode 1 and the field electrode 7 are kept at zero potential, and that the drain electrode 2 is applied with a positive voltage, a portion right under the outmost p-type semiconductor layer 14 will be exposed to a critical electric field $E_C$ immediately before breakdown. With breakdown voltage of the element given as $V_b$, a relation between $V_b$ and $E_C$ holds as below.

$$V_b = E_C \times t_{sj} + (E_C/2) \times (t_{si} - t_{sj})$$

where, $t_{si}$ is thickness of the epitaxial layer 60 of the semiconductor substrate.

Assuming now that the portion right under the insulating film 6 is exposed to a maximum electric field $E_{max}$ immediately before breakdown of the element, a relation between $V_b$ and $E_{max}$ holds as below.

$$V_b = E_{max} \times (\epsilon_{si}/\epsilon_{ox}) \times t_{ox} + (E_{max}/2) \times t_{si}$$

where, $\epsilon_{ox}$ expresses relative dielectric constant the insulating film 6, and $\epsilon_{si}$ expresses relative dielectric constant of the semiconductor substrate 3.

A relation of $E_{max} < E_C$ must hold in order to avoid breakdown in the insulating film region, and the relation expressed by the formula (2) can be derived using two equations in the above.

This is successful in making the insulating film 6 thinner than in the conventional case, under conditions considering relative dielectric constants of the insulating film 6 and semiconductor substrate 3, so that it is made possible to obtain a super-junction semiconductor element having a high voltage resistance and a low resistivity, while reducing the element area.

The insulating film 6 may be such as having a small relative dielectric constant, and more specifically, a relative dielectric constant smaller than that of the general oxide film, and in particular smaller than 3.9. Electric field will largely vary at the interface between semiconductor and insulating film, although dielectric flux will be continuous (dielectric flux D=relative dielectric constant $\epsilon$×electric field E). This equation describes that a smaller relative dielectric constant $\epsilon$ results in a larger electric field E under a constant dielectric flux. On the other hand, breakdown voltage V of a certain film is expressed as V=E×t, where t is thickness of the film. Therefore, it is assumed that, under a constant film thickness t, a smaller relative dielectric constant $\epsilon$ makes it possible to realize a high voltage resistance even under the same film thickness.

It is therefore possible in this embodiment to use an insulating film having a small relative dielectric constant, and use of such insulating film having a small relative dielectric constant allows a large depth $t_{sj}$ of the outermost p-type semiconductor layer 14, satisfying the relation expressed by the above-described formula (2), even if the oxide film of the general thickness is used. In other words, it is made possible to realize a high voltage resistance without specifically using a thick oxide film, because the outermost p-type semiconductor layer 14 can be deepened, and to effectively downsize the element while realizing a low resistivity.

Figure 3:
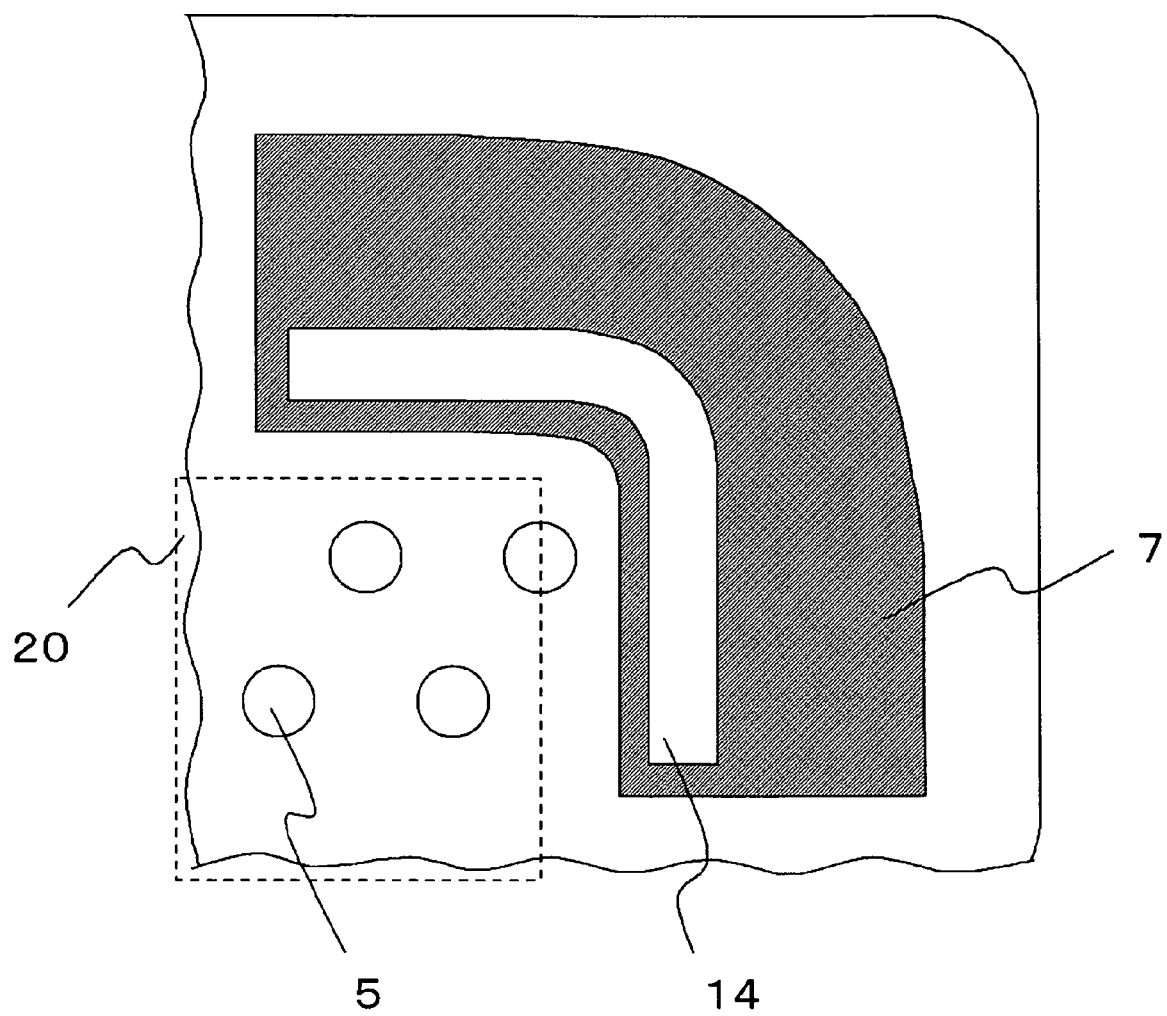
FIG. 3 is an exemplary top view of the first embodiment.

FIG. 3 is a perspective diagram, as viewed from the top, showing a positional relation of the components for better understanding of the geometry of the p-type semiconductor layer in the first embodiment. As shown in FIG. 3, the outermost p-type semiconductor layer 14 is formed with a band pattern, and the field electrode 7 is formed so as to cover the outermost p-type semiconductor layer 14.

Figure 4:
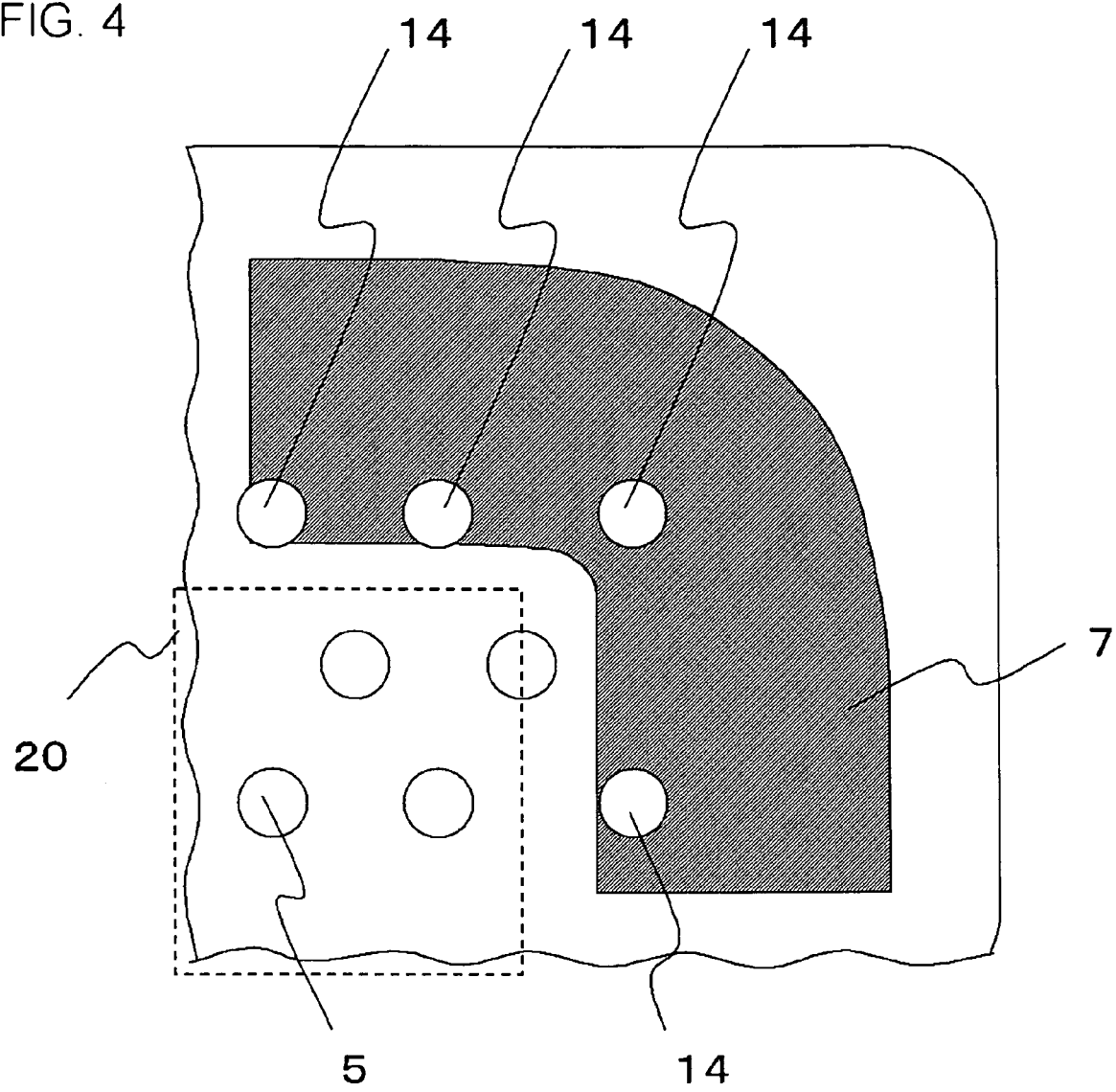
FIG. 4 is another exemplary top view of the first embodiment.

FIG. 4 shows a perspective diagram, as viewed from the top, showing a positional relation of the components for better understanding of the geometry of the p-type semiconductor layer in a modified example of the first embodiment. As shown in FIG. 4, it is also allowable to configure the outermost p-type semiconductor layer 14 as a group of partition regions having a cylindrical columnar form, similarly to other p-type semiconductor layers 5 formed in the element active portion 20. Also in this case, the field electrode 7 may also be formed with a band pattern so as to cover the insulating film 6, because the insulating film 6 is formed so as to surround the outermost p-type semiconductor layer 14.

This embodiment dealt with the case where the insulating film 6 rises up in the depleted region generated outside the outermost p-type semiconductor layer 14, but the position of the rise-up is not limited thereto, and similar effects can be obtained if the rise-up occurs in the depleted region generated inside the outermost p-type semiconductor layer 14.

(Second Embodiment)

Figure 5:
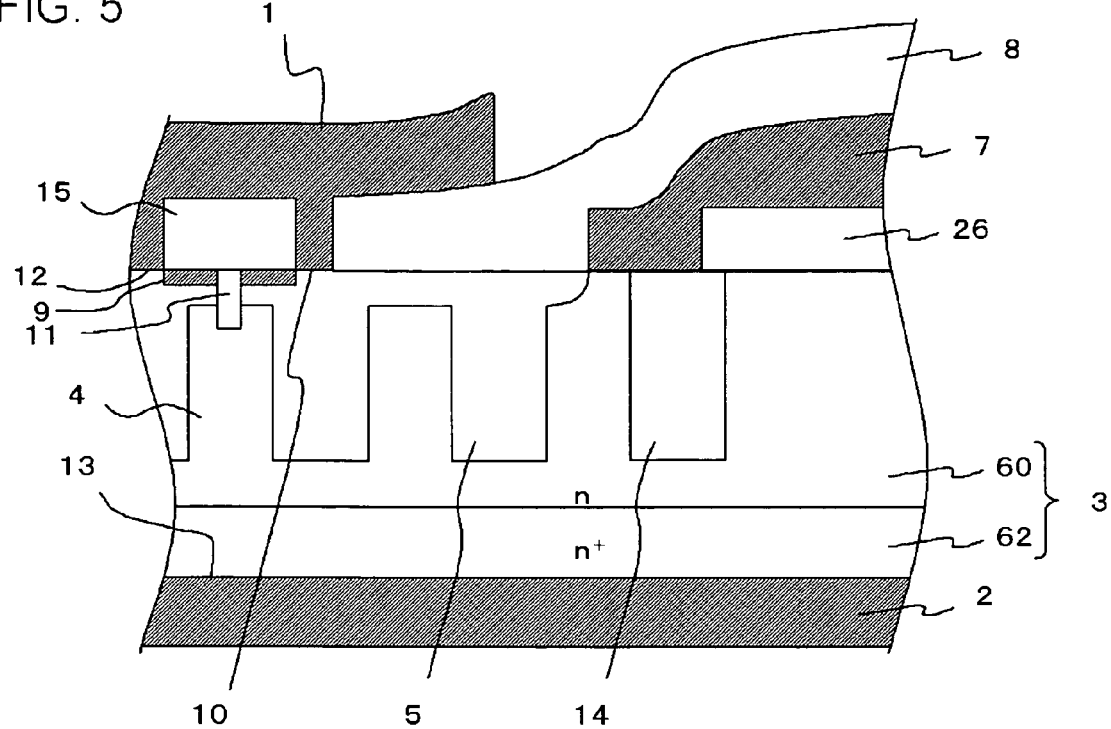
FIG. 5 is a partial sectional view showing a configuration of the outermost portion of the super-junction semiconductor element according to a second embodiment.

FIG. 5 is a partial sectional view showing a configuration of the outermost portion of the super-junction semiconductor element according to a second embodiment.

As shown in FIG. 5, the second embodiment is configured similarly to the first embodiment, except that an insulating film 26, which covers at least a part of the outermost p-type semiconductor layer 14, is used in place of the insulating film 6 in the first embodiment.

By locating the rise-up position of the insulating film 26 on the surface of the outermost p-type semiconductor layer 14, it is made possible to avoid breakdown due to concentration of electric field at the end portion of the parallel pn layer. Because a high voltage resistance of the element can be realized without forming the parallel pn layer also in the outside of the insulating film formed at the end portion of the element in order to prevent the electric field concentration as described in the above, it is made possible to obtain a super-junction semiconductor element having a high voltage resistance and a low resistivity, while reducing the element area. The foregoing paragraphs have described a case where the insulating film 26 was provided so as to cover a part of the outermost p-type semiconductor layer 14, but it is also allowable to form the insulating film 26 so as to cover the entire surface of the outermost p-type semiconductor layer 14.

From the above-described point of view, it is preferable that thickness of the insulating film 26 and depth of the outermost p-type semiconductor layer 14 satisfy the relation expressed by the formula (2).

Also in the second embodiment, the outermost p-type semiconductor layer 14 may be formed with the band pattern as shown in FIG. 3, or as the cylindrical columns as shown in FIG. 4. The field electrode 7 may also be formed with the band pattern in both cases.

It is anticipated herein that the electric field in the semiconductor substrate 3 will be concentrated at the rise-up position of the insulating film 26. It is therefore supposed that the partial coverage of the outermost p-type semiconductor layer 14 by the insulating film 26 takes an advantage over the total coverage, because the rise-up position of the insulating film 26 is located in the outermost p-type semiconductor layer 14 with reduced electric field, and this is supposed to desirably improve the resistance against breakdown caused by concentration of the electric field.

By adjusting the thickness $t_{ox}$ of the insulating film 26 so as to satisfy the relation expressed by the formula (2) considering relative dielectric constants of the insulating film 26 and the semiconductor substrate 3, it is made possible to thin the insulating film under optimum conditions, and to consequently make the super-junction semiconductor element downsized under optimum conditions with respect to voltage applied to the element, while realizing a high voltage resistance and a low resistivity. The low-relative dielectric constant insulating film 26 as described in the above may be low-dielectric also in the present embodiment.

(Third Embodiment)

Figure 6:
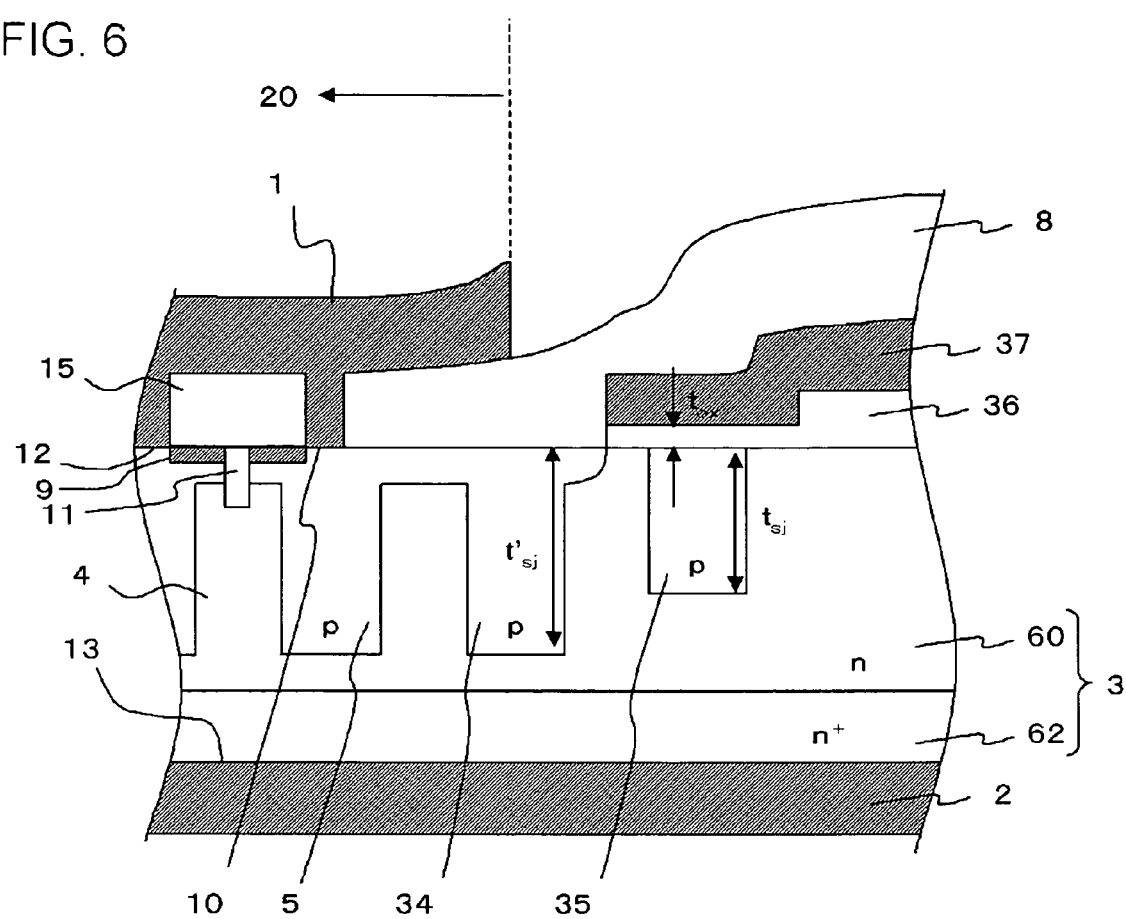
FIG. 6 is a partial sectional view showing a configuration of the outermost portion of the super-junction semiconductor element according to a third embodiment.

FIG. 6 is a partial sectional view showing a configuration of the outermost portion of the super-junction semiconductor element according to a third embodiment.

Configuration of the third embodiment shown in FIG. 6 is similar to the first embodiment, except that an insulating film is formed so as to rise up from the depleted region of the outermost p-type semiconductor layer 14 generated outside the end portion of the p-type bases, unlike the insulating film 6 in the first embodiment. More specifically, an insulating film 36 is formed so as to cover the outermost p-type semiconductor layer 35, a field electrode 37 is formed, in place of the field electrode 7, so as to cover the insulating film 36, and the outermost p-type semiconductor layer 35 is formed, in place of the outermost p-type semiconductor layer 14, so as to have depth $t_{sj}$ smaller than depth $t_{sj}'$ of the adjacent p-type semiconductor layer 34.

The depth $t_{sj}$ of the outermost p-type semiconductor layer 35 may satisfy the relation expressed by the formula (3) below:

$$t_{sj}'-t_{sj}<(2\in_{si}/\in_{ox})\times t_{ox} \quad (3)$$

(where, $t_{sj}'$ is depth of the p-type semiconductor layer 34 adjacent to the outermost p-type semiconductor layer 35, $\in_{si}$ expresses relative dielectric constant of the semiconductor substrate 3 right under the insulating film 36, $\in_{ox}$ expresses relative dielectric constant of the insulating film 36, and $t_{ox}$ expresses mean thickness of the insulating film 36).

These relation will be explained below.

When voltage is applied from the first electrode 1 to the semiconductor substrate 33 through the p-type semiconductor layer 34, which resides on the outermost portion of the element active portion 20, and which is adjacent to the outermost p-type semiconductor layer 35, a portion right under the p-type semiconductor layer 34 is exposed to breakdown electric field $E_C$ immediately before breakdown. Breakdown voltage $V_{B1}$ of the semiconductor substrate 33 can be approximated as below, assuming depth of the p-type semiconductor layers 34 as $t_{sj}'$.

$$V_{B1}=t_{sj}'\times E_C+(E_C/2)\times(t_{si}-t_{sj}')$$

On the other hand, a portion right under the outermost p-type semiconductor layer 35 is also exposed to a maximum electric field immediately before breakdown, where the maximum electric field is given as $E_{max}$. Breakdown voltage $V_{B2}$ of the semiconductor substrate 33 in this portion can be approximated as below, assuming depth of the outermost p-type semiconductor layer 35 as $t_{sj}$, thickness of the insulating film 36 right above the outermost p-type semiconductor layer 35 as $t_{ox}$, and electric field applied to this portion of the insulating film 36 as $E_{ox}$.

$$V_{B2}=t_{sj}\times E_{max}+t_{ox}\times E_{ox}+(E_{max}/2)\times(t_{si}-t_{sj})$$

When relative dielectric constant of the outermost p-type semiconductor layer 35 is given as $\in_{sj}$, and relative dielectric constant of the insulating film 36 as $\in_{ox}$, the equation below holds based on continuity of the dielectric flux density in this portion.

$$\in_{sj}\times E_{max}=\in_{ox}\times E_{ox}$$

Then breakdown voltage $V_{B2}$ can be written as:

$$V_{B2}=\{t_{sj}+(\in_{sj}/\in_{ox})\times t_{ox}+(\frac{1}{2})\times(t_{si}-t_{sj})\}\times E_{max}$$

The relation expressed by the formula (3) can be derived by assuming $V_{B1}=V_{B2}$ in order to smoothen the electric field distribution in the parallel pn layer, and by assuming $E_{max}<E_C$ as a condition not causative of destruction of the super-junction semiconductor element due to the outermost p-type semiconductor layer 35.

It is to be understood herein that FIG. 6 has shown an exemplary case where the insulating film 36 rises up from the depleted region generated inside the outermost p-type semiconductor layer 35, but the position of the rise-up is not limited thereto, and the insulating film 36 may rise up from the depleted region generated outside of the insulating film 36, or even may rise up from the region on the top surface of the outermost p-type semiconductor layer 35.

Figure 7:
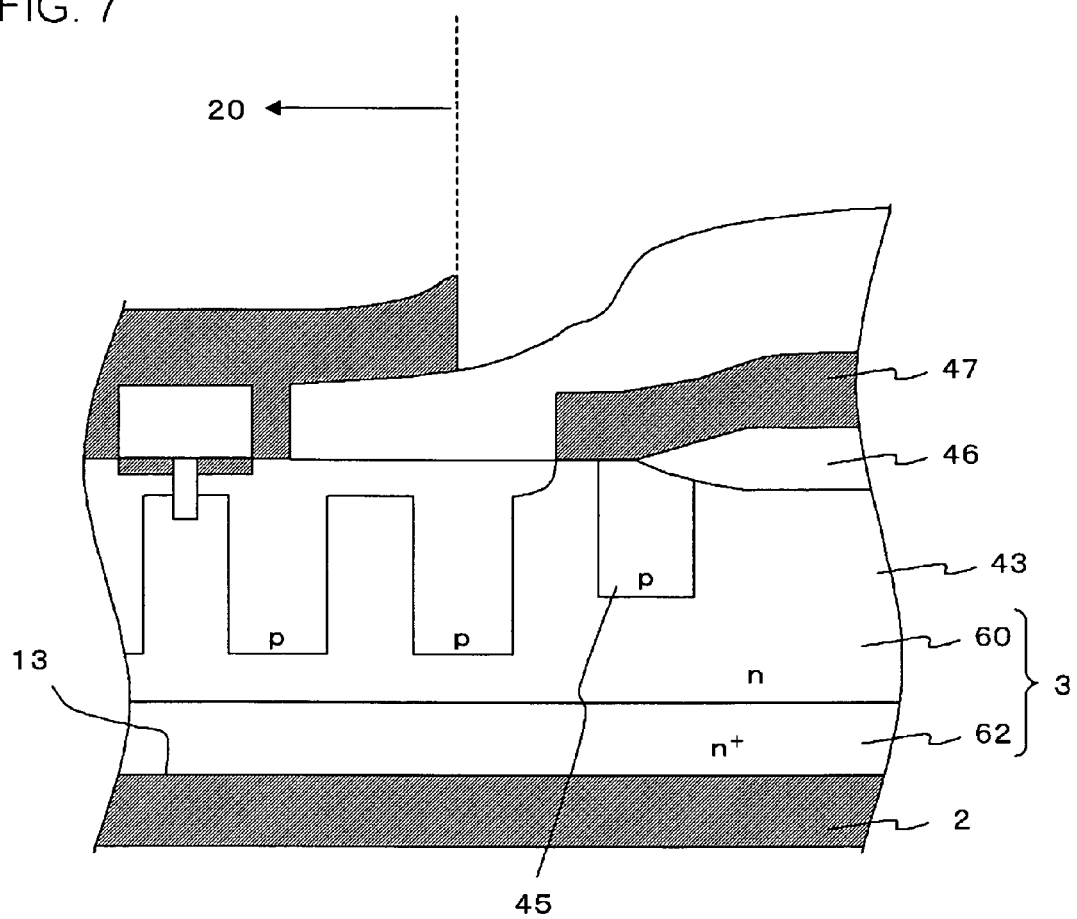
FIG. 7 is a partial sectional view showing a configuration of the outermost portion of the super-junction semiconductor element according to a modified example of the third embodiment.

FIG. 7 is a partial sectional view showing a configuration of the outermost portion having a modified geometry of the insulating film in the third embodiment.

Configuration of the modified embodiment shown in FIG. 7 is similar to the third embodiment of FIG. 6, except that an insulating film 46 is formed, in place of the insulating film 36 in the third embodiment, so that the bird's beak portion thereof is formed so as to cover at least a part of the outermost p-type semiconductor layer 45, and a field electrode 47 is formed, in place of the field electrode 37, so as to rise up from the outside of the edge portion of the p-type bases, and so as to cover the semiconductor substrate 43, outermost p-type semiconductor layer 45 and insulating film 46. The insulating film may be formed so as to have the thickness thereof, in the region where the outermost p-type semiconductor layer 45 is covered, increasing as becoming more distant from the parallel pn layer, and is preferably configured using a LOCOS film formed by the LOCOS (local oxidation of silicon) process, a kind of thermal oxidation process.

Figure 8:
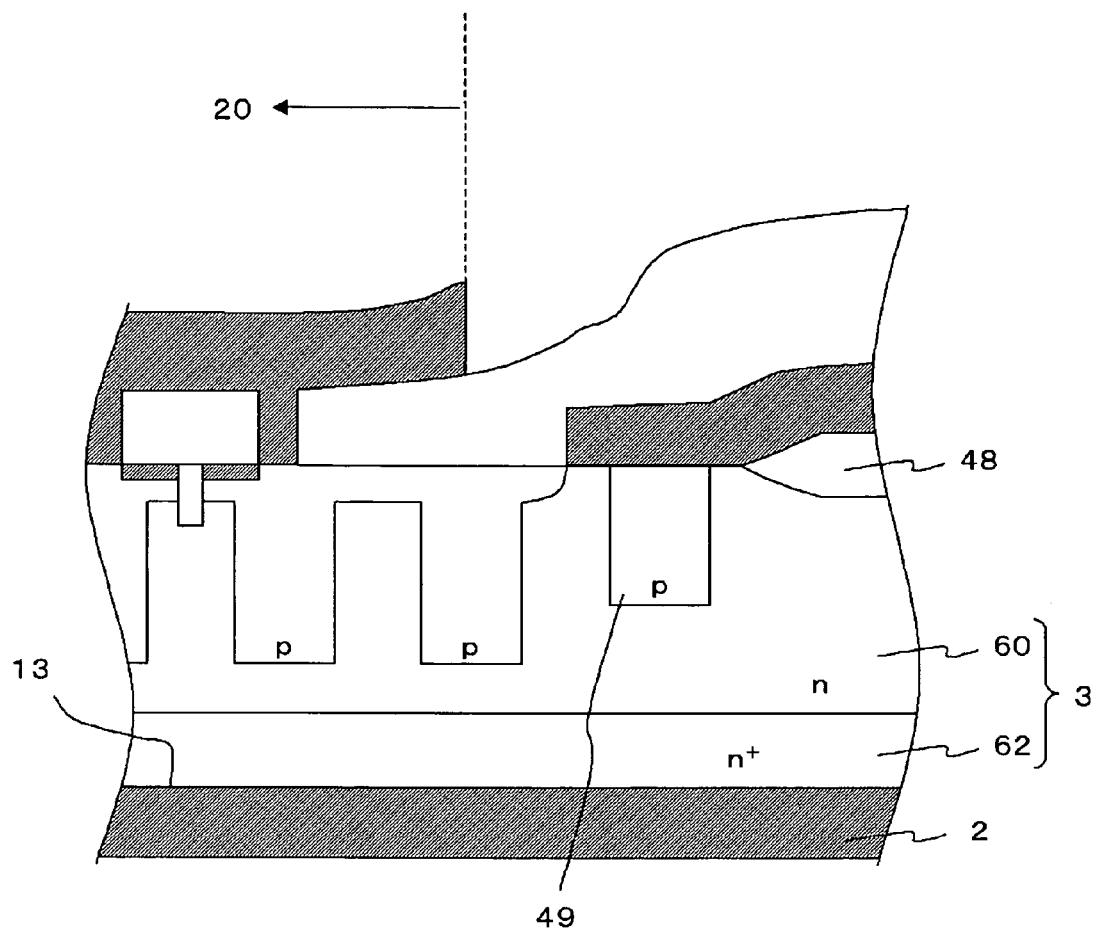
FIG. 8 is a partial sectional view showing a configuration of the outermost portion of the super-junction semiconductor element according to a second modified example of the third embodiment.

FIG. 8 is a partial sectional view showing a configuration of the outermost portion of the super-junction semiconductor element according to a second modified example of the third embodiment.

Configuration of this embodiment shown in FIG. 8 is similar to the modified embodiment shown in FIG. 5, except that the insulating film 46 in the above-described modified example is replaced with an insulating film 48 formed so as to originate from a portion outside, and in the vicinity of, the outermost p-type semiconductor layer 49.

Figure 9:
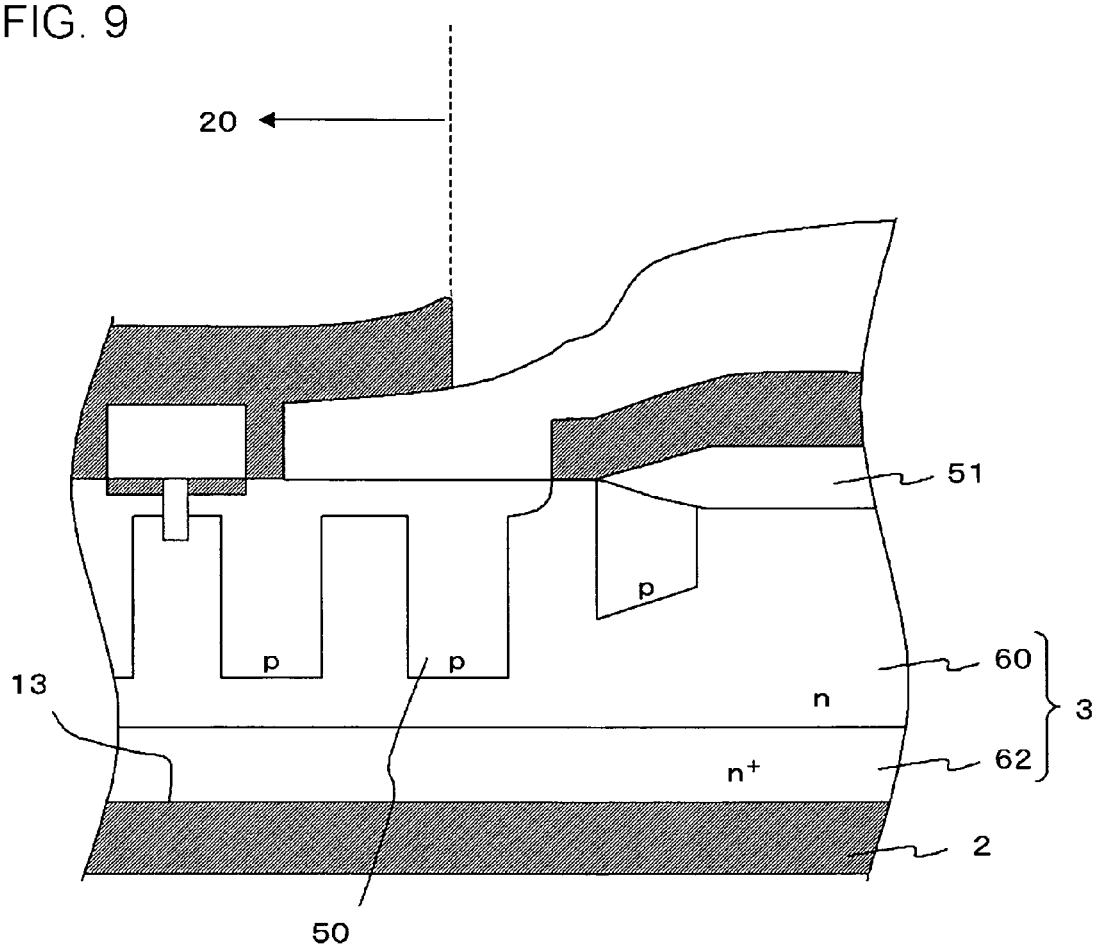
FIG. 9 is a partial sectional view showing a configuration of the outermost portion of the super-junction semiconductor element according to a third modified example of the third embodiment.

FIG. 9 is a partial sectional view showing a configuration of the outermost portion of the super-junction semiconductor element according to a third modified embodiment of the third embodiment.

Configuration of this embodiment shown in FIG. 9 is similar to other modified embodiments, except that an insulating film 51 composed of a LOCOS film is provided so as to extend from the end portion on the element active portion 20 side of the outermost p-type semiconductor layer 50, and so as to have an outwardly decreasing depth.

It is anticipated herein that the electric field in the semiconductor substrate 3 will be concentrated at the rise-up position of the insulating film 46. It is therefore supposed that the partial coverage of the outermost p-type semiconductor layer 45 by the insulating film 46 takes an advantage over the total coverage, because the rise-up position of the insulating film 46 is located in the outermost p-type semiconductor layer 45 with reduced electric field, and this is supposed to desirably improve the resistance against breakdown caused by concentration of the electric field.

Also in the third embodiment and in other modified embodiments, the outermost p-type semiconductor layers 35, 45, 49 may be formed with the band pattern as shown in FIG. 3, or as the cylindrical columns as shown in FIG. 4. The field electrodes 37, 47 may also be formed with the band pattern in both cases.

As described above, even if the outermost p-type semiconductor layers 35, 45, 49 be shallower than the adjacent p-type semiconductor layer 34, it is still made possible to realize a high voltage resistance of the element.

By adjusting depth of the outermost p-type semiconductor layer 35, depth of the p-type semiconductor layer 34 adjacent to the outermost p-type semiconductor layer 35, and thickness of the insulating film 36 so as to satisfy the relation expressed by the formula (3), it is made possible to thin the insulating film under optimum conditions, and to consequently make the super-junction semiconductor element downsized under optimum conditions with respect to voltage applied to the element, while realizing a high voltage resistance and a low resistivity.

It is generally anticipated that the interface between the insulating film and semiconductor substrate will have concentrated therein due to difference in the relative dielectric constants therebetween. On the contrary, adjustment of the relation between the depth of the outermost p-type semiconductor layer and the thickness of the insulating film, and a relation with position of formation of the insulating film within a predetermined range, it is made possible to make the insulating film owe any load ascribable to the electric field. It is also generally anticipated that absence of the outermost p-type semiconductor layer may result in discontinuity of the electric field in the outermost portion of the semiconductor element, and consequently results in breakdown due to concentration of the electric field at a portion of the semiconductor element near the insulating film edge. On the contrary, by keeping the conditions for formation of the outermost p-type semiconductor layer and insulating film within a predetermined relation as described in the present embodiment, it is made possible to make the electric field continuous also in the outermost portion so as to prevent sharp changes in the electric field within the element, and to avoid concentration of the electric field within the n-type semiconductor layer to thereby realize a high voltage resistance.

(Method of Fabricating the Super-Junction Semiconductor Element of the First and Second Embodiments)

FIGS. 10A to 10C, and FIGS. 11A to 11D are drawings showing a method of fabricating the super-junction semiconductor element according to the first and second embodiments, wherein these super-junction semiconductor elements can be fabricated by a combination of publicly-known individual processes. Explanation referring to FIGS. 10A to 10C, and FIGS. 11A to 11D will be made on a super-junction semiconductor element shown in FIG. 1.

Figure 10A:
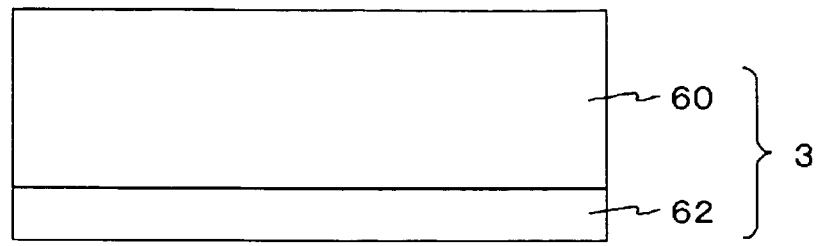
FIGS. 10A to 10C are drawings showing a part of a method of fabricating the super-junction semiconductor element according to the first embodiment and second embodiment.
Figure 10B:
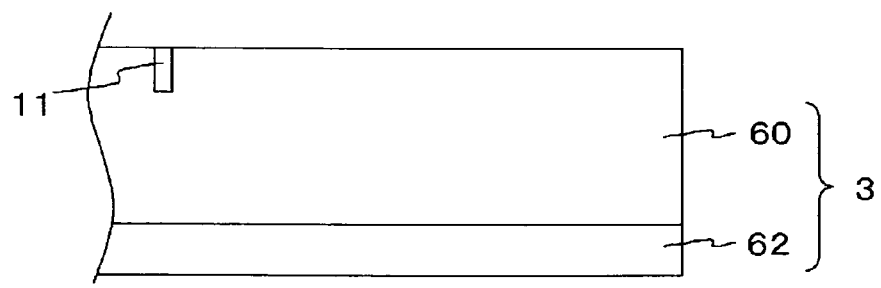
Figure 10C:
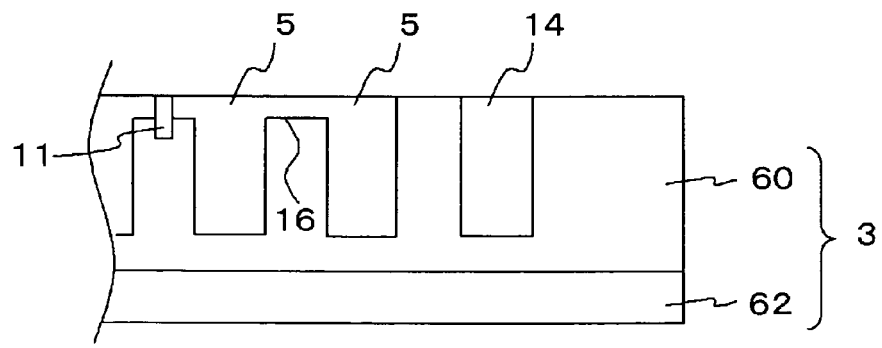

In the semiconductor substrate 3 shown in FIG. 10A, which comprises an $n^+$-type semiconductor layer 62, and an epitaxial layer 60 formed on the surface of the $n^+$-type semiconductor layer 62 typically by epitaxial growth of silicon under phosphorus doping, a trench is formed by photolithographic process and selective etching, and a gate oxide film (not shown) is formed on the inner surface of the trench by the thermal oxidation process. Next, polysilicon is grown by the CVD process so as to fill the trench, the grown polysilicon is removed by the etch-back process so as to leave it only in the trench. Polysilicon thus left in the trench configures the gate electrode 11 (FIG. 10B). Next, the boron ion is implanted while masking the gate electrode 11, the product is annealed, and thereby the p-type semiconductor layers 5, 14 as the second-conductivity-type partition region are formed, and between the p-type semiconductor layers 5 the p-type bases 16 are formed (FIG. 10C). The ion implantation herein may be repeated by multiple times, while varying the ion implantation energy each time, in view of forming the columnar p-type semiconductor layers.

Figure 11A:
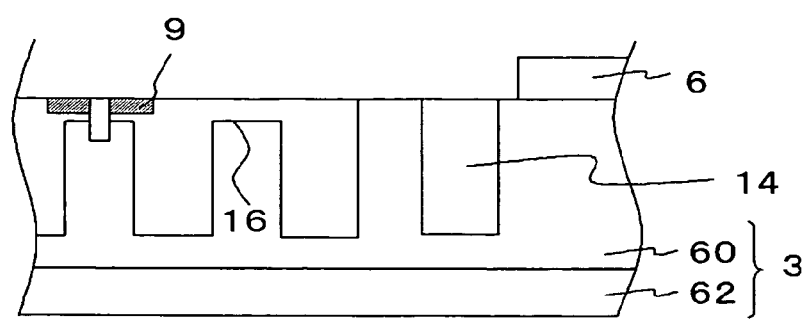
FIGS. 11A to 11D are drawings showing a part of a method of fabricating the super-junction semiconductor element according to the first embodiment and second embodiment.

Next, after photolithographic processes, the p-type semiconductor layers 5 are selectively implanted with As (arsenic) ion, and annealed so as to convert the circumferential and surficial portion of the p-type semiconductor layers 5 (surficial portions of the p-type bases 16) into an $n^+$-type semiconductor layer, to thereby form the source electrode 9 (FIG. 11A). $SiO_2$ is then grown typically by the CVD process in the outer vicinity of the outermost p-type semiconductor layer 14 away from the parallel pn layer, while masking the source electrode 9 and gate electrode 11, to thereby form the insulating film 6 (FIG. 11A).

Figure 11B:
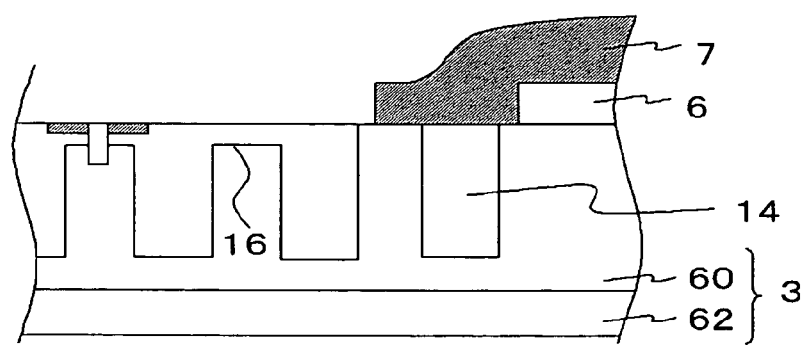

Next, the field electrode 7 is formed so as to cover the outermost p-type semiconductor layer 14 and the insulating film 6 formed in the vicinity thereof, typically by the CVD process forming a polysilicon film (FIG. 11B).

Figure 11C:
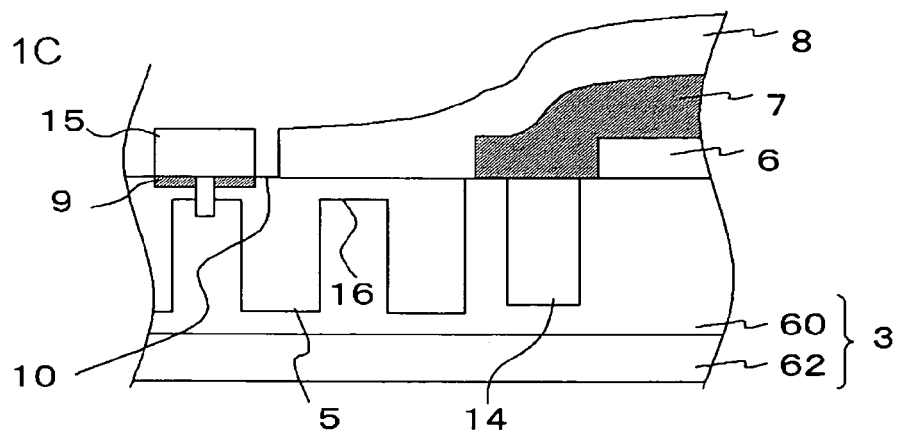

The insulating interlayer is then formed by growing BPSG (borophosphosilicate glass) by the CVD process, and after the photolithographic process, the insulating interlayer is selectively etched so as to form contact holes 10 in regions correspondent to the center surfaces of the p-type semiconductor layers 5, and thereby the insulating film 15 covering the gate electrode 9, and the insulating interlayer 8 are formed (FIG. 11C).

Figure 11D:
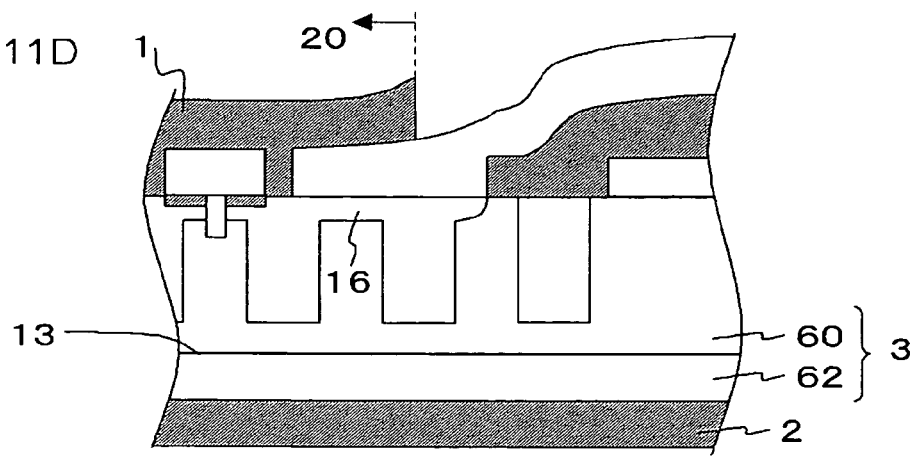

The first electrode (source electrode) 1 is formed on the surface including the inner portions of the contact holes 10 by the sputtering process using an aluminum target, and on the back surface 13 of the semiconductor substrate 3, the second electrode (drain electrode) 2 is similarly formed, and thereby super-junction semiconductor element of the first embodiment can be obtained (FIG. 11D).

(Method of Fabricating the Super-Junction Semiconductor Element of the Third Embodiment)

FIGS. 12A to 12D, and FIGS. 13A to 13C are drawings showing a method of fabricating the super-junction semiconductor element according to the third embodiment. The explanation herein will be made on a super-junction semiconductor element shown in FIG. 6.

Figure 12A:
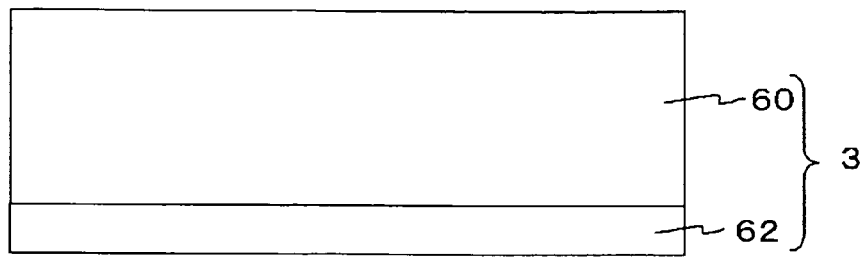
FIGS. 12A to 12D are drawings showing a part of a method of fabricating the super-junction semiconductor element according to the third embodiment.
Figure 12B:
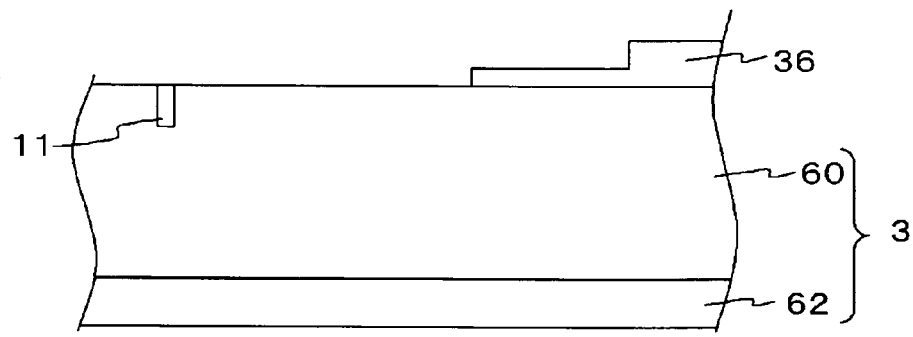

In the semiconductor substrate 3 shown in FIG. 12A, which comprises an $n^+$-type semiconductor layer 62, and an epitaxial layer 60 formed on the surface of the $n^+$-type semiconductor layer 62 typically by epitaxial growth of silicon under phosphorus doping, a trench is formed by photolithographic process and selective etching, and a gate oxide film (not shown) is formed on the inner surface of the trench by the thermal oxidation process. Next, polysilicon is grown by the CVD process so as to fill the trench, the grown polysilicon is removed by the etch-back process so as to leave it only in the trench. Polysilicon thus left in the trench configures the gate electrode 11 (FIG. 12B). Next, SiO$_2$ is grown typically by the CVD process while masking the gate electrode 11, so as to surround the region, of the semiconductor substrate 3, which will later be ion-implanted, and will have the parallel pn region which comprises the n-type semiconductor layers as the first-conductivity-type drift region, and p-type semiconductor layers as the second-conductivity-type partition region, alternately arranged therein, and thereby the insulating film 36 is formed (FIG. 12B).

Figure 12C:
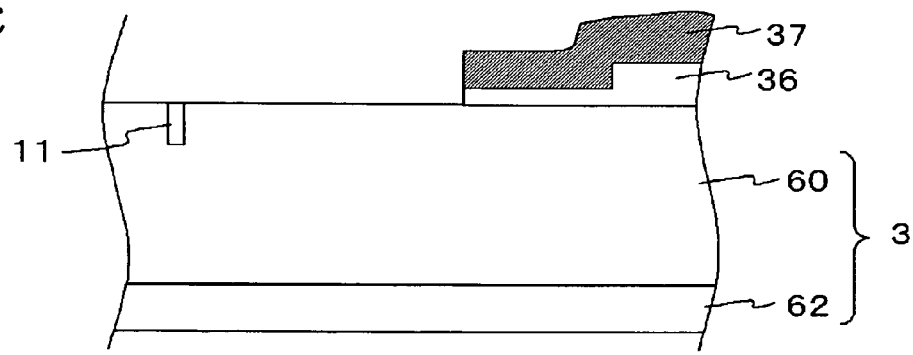

The field electrode 37, or the field plate, is formed so as to cover at least a part (whole in the drawing) of the insulating film 36, typically by the CVD process forming a polysilicon film (FIG. 12C).

Figure 12D:
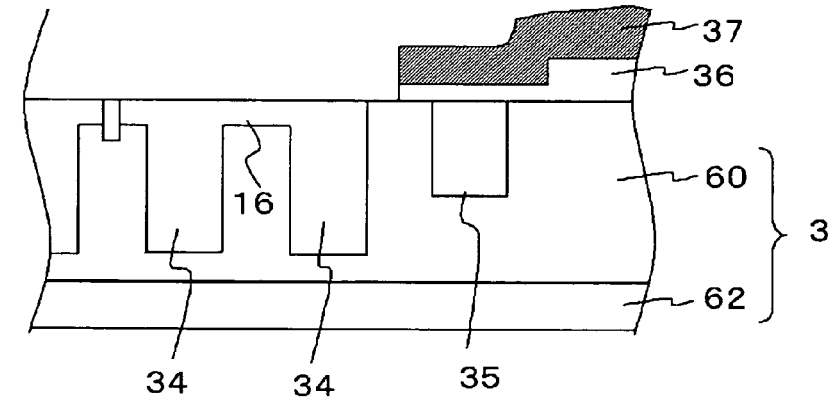

Next, the boron ion is implanted while masking the gate electrode 11, the product is annealed, and thereby the p-type semiconductor layers 34, 35 as the second-conductivity-type partition region are formed, and between the p-type semiconductor layers 5 the p-type bases 16 are formed (FIG. 12D). The ion implantation herein may be repeated by multiple times, while varying the ion implantation energy each time, in view of forming the columnar p-type semiconductor layers.

The outermost p-type semiconductor layer 35 herein has the insulating film 36 and field electrode 37 formed thereon, unlike other p-type semiconductor layers 34, and is consequently formed as being shallower than the other p-type semiconductor layers 34.

The above description dealt with the case where the field electrode 37 was formed before the ion implantation, but the outermost p-type semiconductor layer 35 can be formed as being shallower than the other p-type semiconductor layers 34, even if the field electrode 37 is formed after the ion implantation.

Figure 13A:
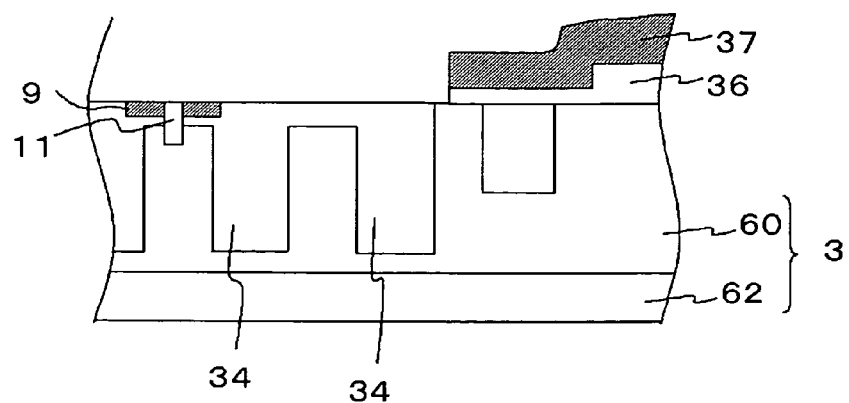
FIGS. 13A to 13C are drawings showing a part of a method of fabricating the super-junction semiconductor element according to the third embodiment.

Next, after photolithographic processes, the p-type semiconductor layers 34 are selectively implanted with As (arsenic) ion, and annealed so as to convert the circumferential and surficial portion of the p-type semiconductor layers 34 (surficial portions of the p-type bases 16) into an n$^+$-type semiconductor layer, to thereby form the source electrode 9 (FIG. 13A).

Figure 13B:
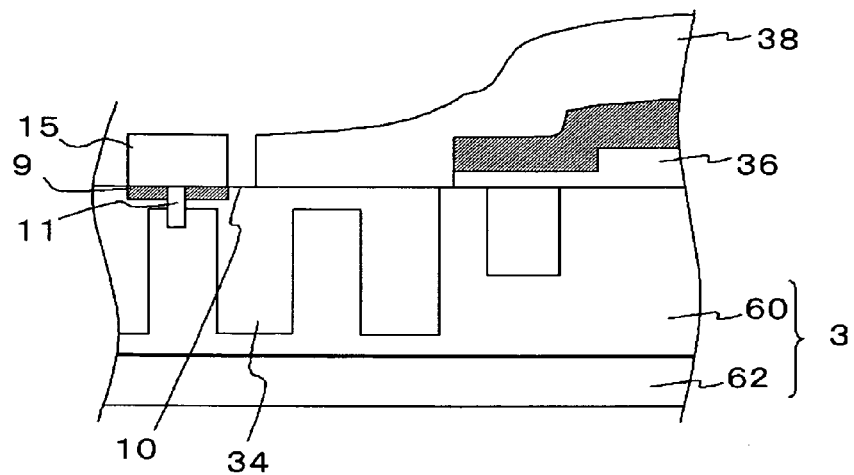

The insulating interlayer is then formed by growing BPSG by the CVD process, and after the photolithographic process, the insulating interlayer is selectively etched so as to form contact holes 10 in regions correspondent to the center surfaces of the p-type semiconductor layers 34, and thereby the insulating film 15 covering the gate electrode 9, and the insulating interlayer 38 are formed (FIG. 13B).

Figure 13C:
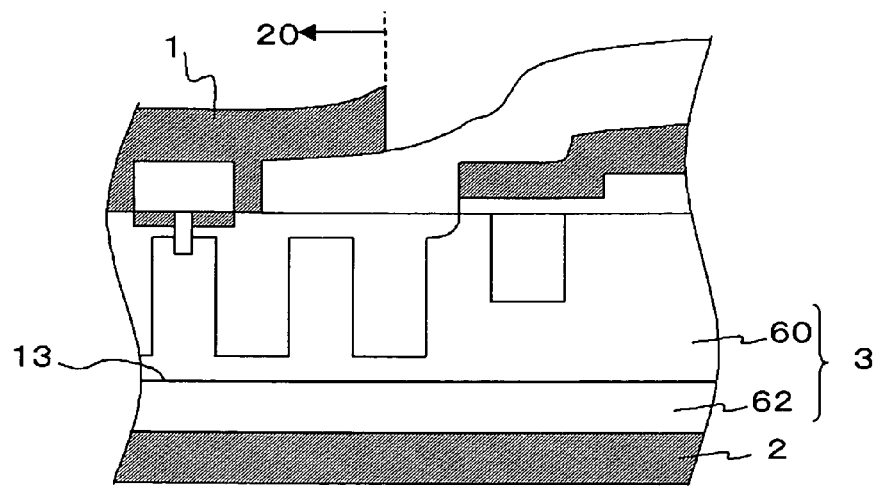

The first electrode (source electrode) 1 is formed on the surface including the inner portions of the contact holes 10 by the sputtering process using an aluminum target, and on the back surface 13 of the semiconductor substrate 3, the second electrode (drain electrode) 2 is similarly formed, and thereby super-junction semiconductor element of the third embodiment can be obtained (FIG. 13C).

The embodiments of the super-junction semiconductor element have been described, but the present invention is by no means limited thereto. For example, the individual embodiments have explained the super-junction semiconductor elements using the n-type semiconductor substrate, and having the drift region composed of the n-type semiconductor layer and the partition region composed of the p-type semiconductor layer formed therein, but effects similar to those of the present invention can be obtained even if the super-junction semiconductor element is configured by exchanging the n-type and p-type semiconductor layers.

The explanation dealt with the power MOSFET as the embodiments of the super-junction semiconductor element, wherein the element is by no means limited thereto, and similar effects can be obtained also for the case where it is typically configured as IGBT (insulated gate bipolar transistor), pn diode, Schottky barrier diode and bipolar transistor.

It is apparent that the present invention is not limited to the above embodiments, which may be modified and changed without departing from the scope and spirit of the invention.

What is claimed is:

1. A super-junction semiconductor element comprising:
a semiconductor substrate;
a pair of electrodes provided respectively on a top surface and a back surface of the semiconductor substrate;
a parallel pn layer provided between the top surface and the back surface of the semiconductor substrate, and allowing current flow under an ON state but being depleted under an OFF state, and having first-conductivity-type drift regions and second-conductivity-type partition regions alternately arranged therein, including at least one outermost partition region;
an insulating film formed on the semiconductor substrate so as to surround said parallel pn layer, wherein said insulating film does not cover any of said at least one outermost partition region; and
a field plate formed so as to cover at least a part of the insulating film.

2. The super-junction semiconductor element according to claim 1, wherein a depth of an outermost second-conductivity-type partition region is smaller than a depth of an adjacent second-conductivity-type partition region.

3. The super-junction semiconductor element as claimed in claim 1, wherein the outermost second-conductivity-type partition region is formed with a band pattern.

4. The super-junction semiconductor element as claimed in claim 1, wherein the outermost partition region of the second-conductivity-type partition region comprises an outermost p-type semiconductor layer.

5. The super-junction semiconductor element as claimed in claim 1, wherein the depleted region of the first-conductivity-type drift region in the outermost partition region comprises an n-type semiconductor layer.

6. The super-junction semiconductor element according to claim 1, wherein a thickness $t_{ox}$ of the insulating film and a depth $t_{sj}$ of an outermost second-conductivity-type partition region satisfy a relation expressed by:

$$\epsilon_{ox}/(2\epsilon_{si}) < t_{ox}/t_{sj}$$

(where, $\epsilon_{ox}$ expresses a relative dielectric constant of the insulating film; and $\epsilon_{si}$ expresses a relative dielectric constant of the semiconductor substrate right under the insulating film).

7. The super-junction semiconductor element according to claim 6, wherein the relative dielectric constant $\epsilon_{ox}$ of the insulating film is smaller than 3.9.

8. The super-junction semiconductor element according to claim 1, wherein the insulating film is formed at a position satisfying:

$$X_F < X_D$$

where, $X_D = (N_A/2N_D) \times X_A$ (where, $X_F$ expresses a distance measured from an outer end portion of an outermost second-conductivity-type partition region, not on the parallel pn layer side, to an end portion on the parallel pn layer side of the insulating film; $X_D$ expresses a thickness of a depleted region; $X_A$ expresses a thickness of the outermost second-conductivity-type partition region; $N_A$ expresses an impurity concentration of the outermost second-conductivity-type partition region; and $N_D$ expresses an impurity concentration of the first-conductivity-type drift region).

9. The super-junction semiconductor element according to claim 8, wherein a thickness $t_{ox}$ of the insulating film and a depth $t_{sj}$ of the outermost second-conductivity-type partition region satisfy a relation expressed by:

$$\epsilon_{ox}/(2\epsilon_{si}) < t_{ox}/t_{sj}$$

(where, $\epsilon_{ox}$ expresses a relative dielectric constant of the insulating film; and $\epsilon_{si}$ expresses a relative dielectric constant of the semiconductor substrate right under the insulating film).

10. The super-junction semiconductor element according to claim 9, wherein the relative dielectric constant $\epsilon_{ox}$ of the insulating film is smaller than 3.9.

11. A super-junction semiconductor element, comprising:
a semiconductor substrate;
a pair of electrodes provided respectively on a top surface and a back surface of the semiconductor substrate;
a parallel pn layer provided between the top surface and the back surface of the semiconductor substrate, and allowing current flow under an ON state but being depleted under an OFF state, and having first-conductivity-type drift regions and second-conductivity-type partition regions alternately arranged therein, including at least one outermost partition region;
an insulating film formed on the semiconductor substrate so as to surround the parallel pn layer, wherein said insulating film does not cover any of said at least one outermost partition region and said insulating film terminates at a location on a surface of the substrate directly above a region of each said at least one outermost partition that is depleted under said OFF state; and
a field plate formed so as to cover at least a part of the insulating film.

* * * * *